United States Patent [19]

Uhl et al.

[11] Patent Number: 5,283,523

[45] Date of Patent: Feb. 1, 1994

[54] SQUID MEASUREMENT APPARATUS WITH A FLUX TRANSFORMER HAVING SHIELDING WITH A DISCONTINUITY

[75] Inventors: Dieter Uhl, Uttenreuth; Heinrich Seifert, Bubenreuth, both of Fed. Rep. of Germany

[73] Assignee: Siemens Aktiengesellschaft, Munich, Fed. Rep. of Germany

[21] Appl. No.: 847,287

[22] Filed: Mar. 10, 1992

[30] Foreign Application Priority Data

Mar. 11, 1991 [EP] European Pat. Off. ........ 91103700.0

[51] Int. Cl.$^5$ .......................................... G01R 33/035
[52] U.S. Cl. ................... 324/248; 324/225; 505/846
[58] Field of Search ............... 324/248, 244, 260, 225, 324/262, 207.12; 336/84 R, 84 C, 84 M; 505/845, 846

[56] References Cited

U.S. PATENT DOCUMENTS

| | | | |
|---|---|---|---|
| 4,491,795 | 1/1985 | Gelinas | 324/248 |
| 4,694,567 | 9/1987 | Daalmans | 29/599 |
| 4,698,000 | 9/1987 | Hoenig | 29/599 |
| 4,761,611 | 2/1988 | Hoenig | 324/248 |
| 4,801,882 | 1/1989 | Daalmans | 324/248 |
| 5,049,818 | 9/1991 | Dössel et al. | 324/248 |

FOREIGN PATENT DOCUMENTS

| | | |
|---|---|---|
| 0184670 | 6/1986 | European Pat. Off. . |
| 0185186 | 6/1986 | European Pat. Off. . |
| 0200080 | 11/1986 | European Pat. Off. . |
| 0359864 | 3/1990 | European Pat. Off. . |
| 0399499 | 11/1990 | European Pat. Off. . |

OTHER PUBLICATIONS

Technisches Messen T.M., vol. 53, No. 7/8, 1986, München, DE, pp. 266-280; Hg. Meyer: *Storfestigkeit von Messsystemen.*
Review of Scientific Instruments, vol. 47, No. 3, Mar. 1976, New York, US, pp. 387-388; J. W. thomassen et al.: *Magnetic Field Shielding by a Superconducting Cylindrical Tube of Finite Length*
Review of Scientific Instruments, vol. 59, No. 4, Apr. 1988, New York, US, pp. 624-626; Van Der Wel et al.: *Cryogenic Current Comparator With Increased Resolution.*
IEEE Transactions On Instrumentation and Measurement, vol. IM-26, No. 1, Mar. 1977, New York, US, pp. 25-28; H. Nakane et al.: *Improving the Frequency Characteristics of RF Standard Magnetic-Field Generator Employing Loop Antenna.*
IBM Technical Disclosure Bulletin, vol. 27, No. 10A, Mar. 1985, New York, US, pp. 5847-5848: *Integrated Thin-Film Miniature Squid Magnetometer.*
IEEE Transactions on electron Devices, vol. ED-27, No. 10, Oct. 1980, pp. 1896-1908, John Clarke: *Advances in SQUID Magnetometers.*
Cryogenics, vol. 29, Aug. 1989, pp. 809-813, H. E. Hoenig et al.: *Biomagnetic Multichannel System with Integrated SQUIDS and First Order Gradiometers Operating in a Shielded Room.*
Biomagnetism, Berlin (West), May 1980, S. N. Erné et al., ©1981, pp. 51-78.

*Primary Examiner*—Walter E. Snow
*Attorney, Agent, or Firm*—Kenyon & Kenyon

[57] ABSTRACT

A SQUID measurement apparatus for detecting weak magnetic field signals that change over time such as from a biomagnetic field source includes at least one measurement channel, a SQUID, and a superconductive flux transformer disposed in front of the SQUID that includes at least one detection loop for receiving the weak magnetic field signals. The apparatus also includes at least one connection conductor coupled to the detection loop and electromagnetically shielding for at least the at least one connection conductor of the flux transformer. The shielding includes at least one superconductive shielding element that extends in a direction substantially parallel to the at least one connection conductor and substantially equidistant from the at least one detection loop. The shielding element has a discontinuity at a separation point in a region of the detection loop.

21 Claims, 2 Drawing Sheets

SQUID MEASUREMENT APPARATUS WITH A FLUX TRANSFORMER HAVING SHIELDING WITH A DISCONTINUITY

BACKGROUND OF THE INVENTION

The invention relates to a SQUID measurement apparatus for detecting weak magnetic field signals that change over time such as from a biomagnetic field source. The apparatus includes at least one measurement channel having a SQUID, a superconductive flux transformer arranged in front of the SQUID that has at least one detection loop for receiving the field signals and at least one connection conductor connected to this loop. Shielding means are assigned to the connection conductor of the flux transformer. Such a SQUID measurement device is disclosed in EP-B-0 185 186, for example.

Using superconductive quantum interferometers, which are also known as "SQUIDs" (which is an abbreviation of Superconducting QUantum Interference Devices), extremely weak magnetic fields can be measured (cf. "IEEE Trans. El. Dev.," Vol. ED-27, No. 10, Oct. 1980, pages 1896 to 1908, for example). For this reason, medical diagnostics is considered a preferred area of application for SQUIDs, since the biomagnetic signals that are produced, e.g. the magnetic fields generated by the human heart or the human brain (magnetocardiography or magnetoencephalography), provide field intensities that are only in the pT range.

An apparatus for detecting and processing such weak magnetic fields that are dependent on time and special location contains at least one measurement or detection channel. This channel has a so-called flux transformer with at least one antenna formed as a gradiometer or magnetometer and, if necessary, it also has a coupling coil. Furthermore, a SQUID circuit is arranged after the flux transformer, which generally includes a SQUID, a modulation coil integrated into the circuit, and an amplifier and evaluation electronics. Except for the amplifier and the evaluation electronics, the above-mentioned components are formed from a superconductive material and are housed in a corresponding cryosystem in order to provide a superconductive operating environment. The antenna is formed from at least one detection loop for detecting the field signals of the field source. The corresponding measurement signal reaches the SQUID circuit via at least one superconductive connection conductor connected with the detection loop. For measuring the flux coupled into this circuit, or for measuring flux gradients, both RF SQUIDs (high-frequency or radio-frequency SQUIDs) as well as DC SQUIDs (direct current SQUIDs) are used. A measurement device having a plurality of correspondingly structured measurement channels is disclosed, for example, in the publication "Cryogenics," Vol. 29, Aug. 1989, pages 809 to 813.

In the operation of open SQUID measurement devices, for making biomagnetic measurements, for example, in which the field sources are located outside the cryosystem there are significant problems which result from high-frequency electromagnetic interference that radiates into the field-sensitive parts of the measurement device. The high-frequency interference, which mainly reaches the SQUID via connectors of the flux transformer which are difficult to filter, blur the structure of the non-linear SQUID characteristic and thereby reduce the signal delivered by the SQUID. This results in increased noise in the measurement device, in an undesirable detection of frequency and amplitude of the most unstable interference generator, or in some cases even in complete failure of the corresponding measurement channel.

Since no effective high-frequency filters can be inserted in the lines of the flux transformer, and in addition, since most measurement structures cannot be designed to properly take high frequencies into account due to the low frequencies to be detected, passive shielding techniques have been mainly used until now. However, these shielding techniques were generally not carried out in the immediate vicinity of the flux transformer, particularly in the vicinity of the detection loop, since at this location, the use of normal conductive materials leads to an increase in noise in the measurement channel due to thermal fluctuations, while superconductive materials distort or completely displace the field signal to be detected. For this reason, the measurement device disclosed in EP-B-0 185 186, mentioned above, provides shielding only by means of a superconductive track along the connection conductor of the flux transformer.

Because of the above-mentioned problems, the entire measurement space may be housed, for example, in a shielding chamber (cf. the reference from "Cryogenics" as cited, or "Biomagnetism—Proceedings Third International Workshop on Biomagnetism, Berlin, May 1980," pages 51 to 78). In this case, however, complicated filters for electrical supply lines or optical data transmission parts are required. Also, another known method includes temporary shielding with aluminum foils on the outside walls of a SQUID measurement system. Such shielding is not very effective, however, and furthermore, increases the noise.

The problem with the prior art is that there is no measurement device having detection loops forming magnetometers or gradiometers that provide simplified shielding measures in comparison to known methods of shielding.

SUMMARY OF THE INVENTION

The present invention provides a SQUID measurement apparatus for detecting weak magnetic field signals that change over time such as from a biomagnetic field source. The apparatus includes at least one measurement channel, a SQUID, and a superconductive flux transformer disposed in front of the SQUID that includes at least one detection loop for receiving the weak magnetic field signals. The apparatus also includes at least one connection conductor coupled to the detection loop and means for electromagnetically shielding at least the at least one connection conductor of the flux transformer. The shielding means including at least one superconductive shielding element that extends in a direction substantially parallel to the at least one connection conductor and substantially parallel to the at least one detection loop. The shielding element has a discontinuity at a separation point in a region of the detection loop.

The present invention provides practically complete electrical shielding of the parts of the flux transformer that are exposed to undesirable interference signals and to the field signals to be detected. In this case, shielding takes place using the arrangement of a superconductive conductor structure, located in the immediate vicinity of the conductor of these exposed transformer parts. In this connection, a complete interruption in the shielding is provided at a point located along the circumference of the at least one detection loop, so that the loop is shielded from electrical fields, but not from the magnetic fields to be measured. Because the corresponding superconductive shielding element is located in the immediate vicinity of the detection conductor, it also advantageously does not cause any significant field distortions. Furthermore, because superconductive materials are used, no noise fluxes are induced in the detection loop. Another significant advantage provided by the invention is that the superconductive shielding element can be implemented in a very simple manner.

DETAILED DESCRIPTION

Figure 1:
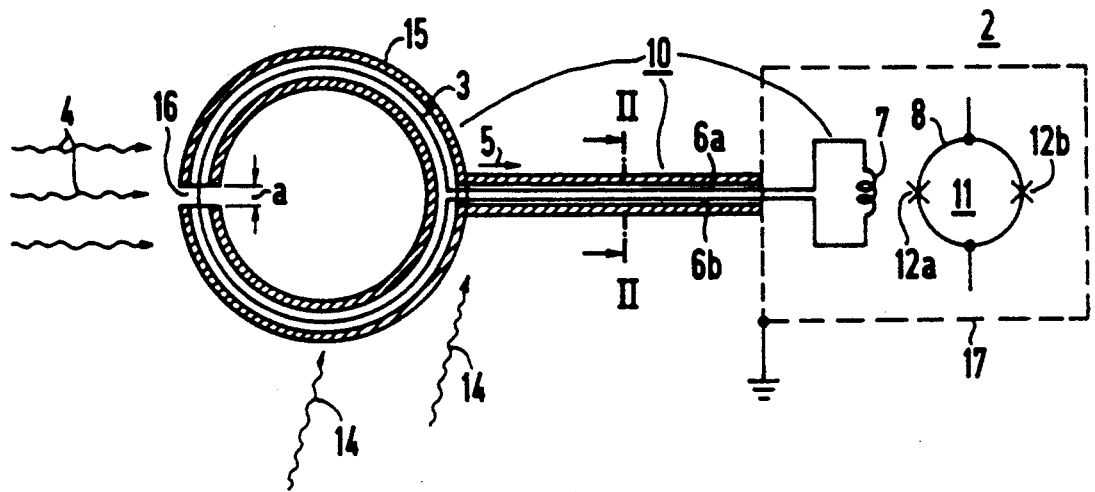
FIGS. 1 and 2 schematically illustrate a longitudinal sectional and a cross-sectional view, respectively, through a flux transformer of a measurement device constructed according to the principles of the invention.

The parts of the measurement device of the present invention shown in FIG. 1 are intended to be at a sufficiently low temperature so that the superconductive material incorporated therein is cooled, particularly to the boiling temperature of liquid helium (LHe), which is 4.2 K. If necessary, the superconductive parts can may be manufactured from known metal-oxide high $T_c$ superconductor materials, which can be cooled with liquid nitrogen ($LN_2$). The measurement device, designated in general by reference numeral 2, may have one or several parallel measurement channels. Parts not shown in greater detail in the drawing are generally known (cf. the stated publication "Cyogenics" or EP-A-0 359 864). The one measurement channel on which the illustrated embodiment is based contains a detection loop 3 forming a magnetometer, which forms the antenna magnetic field generated by at least one field source to be detected. The field signal 4 can be of relatively low frequency, particularly if the source is a biomagnetic field source. The field source 4 causes a measurement signal, designated in general by reference numeral 5, to occur in the detection loop 3. This measurement signal is passed, via two superconductive connection conductors 6a and 6b, to a coupling coil 7, which is coupled inductively to a loop 8 of a SQUID. The detection loop 3, the connection conductors 6a and 6b, as well as the coupling coil 7, thus represent a superconductive flux transformer, designated in general by reference numeral 10. Pursuant to the embodiment of the invention shown in FIG. 1, a DC SQUID 11 with two Josephson tunnel elements 12a and 12b is utilized. However, RF SQUIDs may also be used. The SQUID signal that is generated by the SQUID 11 is then passed to signal-processing electronics for further processing and display. These parts of the measurement device, which are generally known, are not shown in the Figures and are generally maintained at room temperature.

The present invention provides additional measures for shielding the exposed parts of the flux transformer 10 (i.e. the parts exposed to higher-frequency, electromagnetic radiation 14 from an interference source). To accomplish this, at least one superconductive shielding element 15 is arranged parallel to the exposed parts of the connection conductors 6a and 6b, and equidistant from the at least one detection loop 3, with the shielding element 15 being located in their immediate vicinity in each case. This element must have a complete discontinuity that may be slit-like, for example, at a separation point 16 that is located on the circumference of the detection loop 3, so that the loop 3 is shielded from electrical signals, but not from the magnetic field signals 4 to be detected. The length "a" of the separation point 16 in the circumferential direction of the loop (i.e., along the longitudinal extent of the loop conductor) may be between 0.1 and 0.5 mm, for example, for typical loops 3 having a diameter of about 2 cm.

The detection loop 3 and the connection conductors 6a and 6b may be produced from a superconductive wire, for example. As is particularly evident from the cross-sectional view shown in FIG. 2, which is taken along the line II—II in FIG. 1 a superconductive shielding element 15 is located in the region of the connection conductors 6a and 6b. The shielding element 15 is in the form of a capillary-like (i.e. pipe-shaped) sheath 15' and is suitable for wire conductors. This sheath can be composed of several pipe-shaped segments, for example. Pursuant to the embodiment shown in the Figures, one of the segments jointly surrounds the two connection conductors 6a and 6b, while at least one additional segment sheathes the detection loop 3 except for the separation point 16. Furthermore, it is also possible to arrange each of the two connection conductors 6a and 6b in their own sheath pipe, with each sheath pipe extending to the separation point 16, thereby enclosing one half of the detection loop. In this case, the two sheath pipes are to be connected in a superconductive manner (i.e. short-circuited) at least in the region of the ends of the two connection conductors.

As is also evident from FIG. 1 the sheath is connected to a shielding 17 surrounding the SQUID region, as indicated in the Figure by the broken line, which is connected to ground potential. Thus, the sheath is also grounded. If one end of the detection loop 3 itself is placed at ground potential, only a single connection conductor enclosed by the sheath 15' may be necessary.

The capillary-like shielding element 15 (i.e. the sheath 15') may be formed from a thin-wall hollow pipe made of a known superconductive material, such as Nb, a Nb alloy or compound, Pb or a Pb alloy, or of an In alloy, which are within the scope of LHe technology. For example, a Pb-Sn alloy has the additional advantage of being easy to solder. For superconductive wires forming the conductor parts 3, 6a and 6b with a diameter d of 50 to 150 μm, for example, the inner diameter D of the sheath 15' may be between 200 and 300 μm and its wall thickness s may be between 150 and 350 μm, for example.

Figure 2:
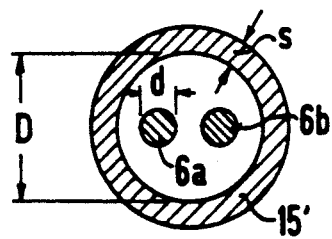
Figure 3:
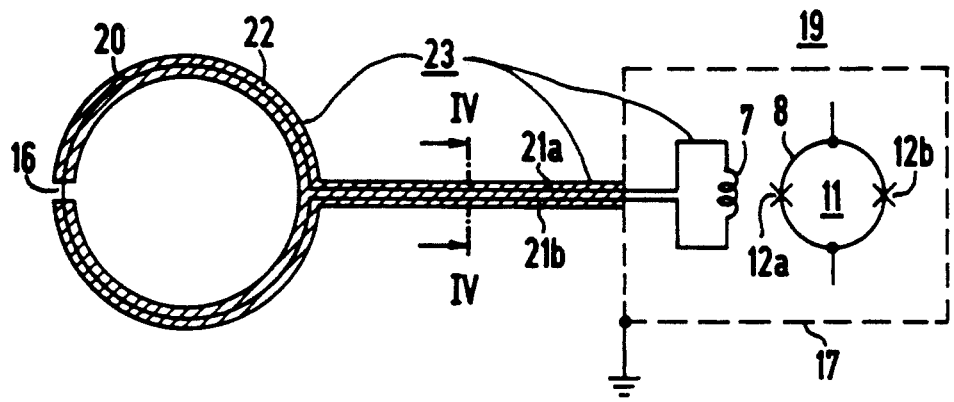
FIGS. 3 and 4 schematically show a top view and a cross-sectional view, respectively, of an alternative embodiment of the flux transformer of the invention.
Figure 4:
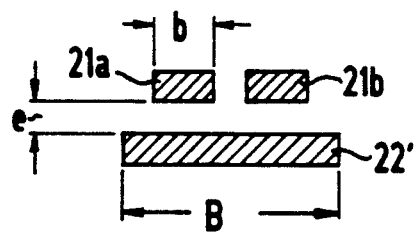

The embodiment of the invention illustrated in FIGS. 1 and 2 are formed from wire components. However, the individual conductors of the flux transformer 10 as well as the shielding measures of the present invention may just as well be implemented using thing-film technology. The embodiment of the invention shown in FIGS. 3 and 4 corresponds to that shown in FIGS. 1 and 2, respectively, where FIG. 3 is a top view, and FIG. 4 is a cross-sectional view taken along IV—IV in FIG. 3. In this thin-film embodiment of the present invention, the conductors of the detection loop 20 extend individually, and the exposed conductor parts of connection conductors 21a and 21b extend parallel to one another via a superconductive track 22' which forms the shielding element 22. It is advantageous if in each case the shielding track 22' has a width B that is greater than the conductor parts it shields. For example, the shielding track 22" may have a width B of about 300 μm in the region of the connection conductors 21a and 21b, while the connection conductors themselves each have a width of about 50 μm. The distance "e" between the conductor parts 20, 21a and 21b, and the track 22' is very small, and amounts to between 5 and 50 μm, for example. The track 22' is in turn connected to ground potential via the SQUID shielding 17 and may be formed from the above-mentioned superconductive materials, by means of known thin-film techniques.

So that the detection loop 20 is not shielded from the magnetic fields to be measured in this thin-film embodiment of the invention, a corresponding discontinuity in the shielding track 22' is provided at a separation point 16 on the circumference of the loop 20, as in the wire embodiment shown in FIG. 1. The field signals 4 can enter the detection loop 20 via this discontinuity, while the electrical shielding of the superconductive flux transformer 23, which is formed from the conductor parts 20, 21a, 21b and 7, is not adversely affected to a significant degree.

Instead of providing shielding on only one side by a single shielding track 22', as is seen in FIG. 4, the individual conductor parts 20, 21a and 21b may also extend between two correspondingly structured shielding tracks.

What is claimed is:

1. A SQUID measurement apparatus for detecting weak magnetic field signals that change over time, said apparatus comprising: at least one measurement channel that has a SQUID and a superconductive flux transformer disposed in front of the SQUID, the transformer including at least one detection loop for receiving the weak magnetic field signals and at least one connection conductor coupled to said detection loop; means for electromagnetically shielding at least said at least one connection conductor and said at least one detection loop of said flux transformer, said shielding means including at least one superconductive shielding element extending in a direction essentially parallel to said at least one connection conductor and essentially to said at least one detection loop, said shielding element having a discontinuity at a separation point in a region of said detection loop and being connected to ground potential.

2. The apparatus of claim 1 wherein said shielding element comprises a sheath enclosing the shielded part of the detection loop and the connection conductor of the flux transformer.

3. The apparatus of claim 2 further comprising a plurality of connection conductors associated with said flux transformer, said plurality of connection conductors being enclosed by said shielding sheath.

4. The apparatus of claim 2 wherein said shielded part of the detection loop and said connection conductor enclosed by said shielding sheath are formed from wire.

5. The apparatus of claim 1 wherein said shielding element comprises at least one track extending essentially parallel to said at least one connection conductor and to said at least one detection loop.

6. The apparatus of claim 5 wherein said flux transformer comprises a plurality of connection conductors that have a common shielding track.

7. The apparatus of claim 5 wherein said shielding track has a width greater than that of said detection loop and said connection conductor assigned thereto.

8. The apparatus of claim 7 wherein said shielding track, as well as said detection loop and connection conductor assigned thereto, are formed from thin-film components.

9. The apparatus of claim 1 wherein said shielding element is coupled to a shield of said SQUID to maintain said shielding element at ground potential.

10. The apparatus of claim 5 wherein said shielding element is coupled to a shield of said SQUID to maintain said shielding element at ground potential.

11. The apparatus of claim 6 wherein said shielding element is coupled to a shield of said SQUID to maintain said shielding element at ground potential.

12. The apparatus of claim 1 wherein said shielding element is formed from a material selected from the group consisting of Nb, Pb and In.

13. The apparatus of claim 9 wherein said shielding element is formed from a material selected from the group consisting of Nb, Pb and In.

14. The apparatus of claim wherein said shielding element is formed from an alloy having at least one component selected from the group consisting of Nb, Pb and In.

15. The apparatus of claim 9 wherein said shielding element is formed from an alloy having at least one component selected from the group consisting of Nb, Pb and In.

16. The apparatus of claim 13 wherein said shielding element is formed from an alloy having at least one component selected from the group consisting of Nb, Pb and In.

17. The apparatus of claim 1 wherein said shielding element is formed from a compound having at least one component selected from the group consisting of Nb, Pb and In.

18. The apparatus of claim 9 wherein said shielding element is formed from a compound having at least one component selected from the group consisting of Nb, Pb and In.

19. The apparatus of claim 1 wherein said discontinuity of said shielding element located at the separation point along said loop conductor has a length between 0.1 and 0.5 mm.

20. The apparatus of claim 12 wherein said discontinuity of said shielding element located at the separation point along said loop conductor has a length between 0.1 and 0.5 mm.

21. The apparatus of claim 1 wherein the weak magnetic signals to be detected are generated by at least one biomagnetic field source.

* * * * *